(12) United States Patent
Fukushima et al.

(10) Patent No.: US 8,008,205 B2
(45) Date of Patent: Aug. 30, 2011

(54) METHODS FOR PRODUCING A SEMICONDUCTOR DEVICE HAVING PLANARIZATION FILMS

(75) Inventors: Yasumori Fukushima, Nara (JP); Yutaka Takafuji, Nara (JP); Michiko Takei, Nara (JP); Kazuhide Tomiyasu, Nara (JP)

(73) Assignee: Sharp Kabushiki Kaisha, Osaka-Shi Osaka (JP)

( * ) Notice: Subject to any disclaimer, the term of this patent is extended or adjusted under 35 U.S.C. 154(b) by 356 days.

(21) Appl. No.: 12/159,582

(22) PCT Filed: Oct. 13, 2006

(86) PCT No.: PCT/JP2006/320492
§ 371 (c)(1),
(2), (4) Date: Jun. 27, 2008

(87) PCT Pub. No.: WO2007/102248
PCT Pub. Date: Sep. 13, 2007

(65) Prior Publication Data
US 2010/0148261 A1 Jun. 17, 2010

(51) Int. Cl.
*H01L 21/311* (2006.01)
(52) U.S. Cl. ........ 438/699; 438/150; 438/198; 438/413; 438/459; 438/481
(58) Field of Classification Search .......... 438/699
See application file for complete search history.

(56) References Cited

U.S. PATENT DOCUMENTS

| | | | |
|---|---|---|---|
| 6,057,211 A * | 5/2000 | Schwalke | 438/428 |
| 6,191,007 B1 | 2/2001 | Matsui et al. | |
| 7,205,204 B2 | 4/2007 | Ogawa et al. | |
| 2002/0137265 A1 * | 9/2002 | Yamazaki et al. | 438/150 |
| 2005/0067619 A1 | 3/2005 | Takafuji et al. | |
| 2005/0087739 A1 | 4/2005 | Ogawa et al. | |
| 2005/0245046 A1 | 11/2005 | Takafuji et al. | |
| 2007/0108523 A1 | 5/2007 | Ogawa et al. | |
| 2009/0191671 A1 | 7/2009 | Takafuji et al. | |

FOREIGN PATENT DOCUMENTS

| | | |
|---|---|---|
| EP | 1 517 363 | 3/2005 |
| EP | 1 526 567 | 4/2005 |
| EP | 1 580 813 | 9/2005 |
| JP | 11-186186 | 7/1999 |
| JP | 2005-93757 | 4/2005 |
| JP | 2005-150686 | 6/2005 |
| JP | 2005-285850 | 10/2005 |

OTHER PUBLICATIONS

International Search Report for PCT/JP2006/320492, mailed Jan. 9, 2007.
Bruel, M et al., "Smart-Cut: A New Silicon on Insulator Material Technology Based on Hydrogen Implantation and Wafer Bonding", JPN. J. APPL. PHYS., vol. 36, pp. 1636-1641, (1997).

* cited by examiner

*Primary Examiner* — Ajay K Arora
(74) *Attorney, Agent, or Firm* — Nixon & Vanderhye P.C.

(57) ABSTRACT

A method of the present invention includes a first planarization film formation step of forming, in at least part of a flat portion of the second regions, a first planarization film so as to have a uniform thickness; a second planarization film formation step of forming a second planarization film between the first planarization films to be coplanar with a surface of the first planarization film; a peeling layer formation step of forming a peeling layer by ion implantation of a peeling material into the base layer via the first planarization film or the second planarization film; and a separation step of separating part of the base layer along the peeling layer.

14 Claims, 13 Drawing Sheets

METHODS FOR PRODUCING A SEMICONDUCTOR DEVICE HAVING PLANARIZATION FILMS

This application is the U.S. national phase of International Application No. PCT/JP2006/320492, filed 13 Oct. 2006, which designated the U.S. and claims priority to Japan Application No. 2006-063170, filed 8 Mar. 2006, the entire contents of each of which are hereby incorporated by reference.

TECHNICAL FIELD

The present invention relates to a semiconductor device and method for producing the same.

BACKGROUND ART

Conventionally, a SOI (silicon on insulator) substrate that is a silicon substrate in which a monocrystal silicon layer is formed on a surface of an insulation layer has been known. By forming a device such as a transistor on a SOI substrate, parasitic capacitance can be reduced and insulation resistance can be increased. That is, high-integration and high-performance for a device can be achieved. The insulation layer is formed of, for example, a silicon oxide ($SiO_2$) film.

To increase an operation speed of a device and further reduce parasitic capacitance of the device, the SOI substrate is preferably formed so that a monocrystal silicon layer has a small thickness. Then, conventionally, a method in which a silicon substrate is bonded to some other substrate such as a glass substrate and then part of the silicon substrate is removed by separation, thereby forming a SOI substrate, has been known (see, for example, Non-Patent Document 1).

Hereinafter, a method for forming a SOI substrate by bonding will be described with reference to FIG. 20 to FIG. 23. Among various techniques for reducing the thickness of a SOI layer, such as chemical polishing and a technique using porous silicon, a method using hydrogen implantation will be herein described. First, as shown in FIG. 20, a surface of a silicon substrate 101 serving as a first substrate is treated by oxidation, thereby forming a silicon oxide ($SiO_2$) layer 102 serving as an insulation layer. Next, as shown in FIG. 21, ions of hydrogen, i.e., a peeling material are implanted into the silicon substrate 101 through the silicon oxide ($SiO_2$) layer 102. Thus, a hydrogen-implanted layer 104 serving as a peeling layer is formed in part of the silicon substrate 101 located at a predetermined depth. Subsequently, RCA cleaning or like substrate surface cleaning is performed, and then, as shown in FIG. 22, a second substrate such as a glass substrate 103 is bonded to a surface of the silicon oxide layer 102. Thereafter, heat treatment is performed, so that a micro-clack is formed in part of the silicon substrate 101 located at the depth where hydrogen ions have been implanted. Thus, as shown in FIG. 23, part of the silicon substrate 101 is separated along the hydrogen-implanted layer 104. In this manner, the thickness of the silicon substrate 101 is reduced, thereby obtaining a silicon layer 101. After separation, the thickness of the silicon layer 101 is reduced to a desired thickness using polishing, etching or other various techniques as necessary. Also, using heat treatment or the like, crystal defects generated by hydrogen implantation is repaired and a silicon surface is smoothed.

As described above, the SOI substrate where the $SiO_2$ layer (insulating layer) 102 is formed on the surface of the silicon substrate (second substrate) 103 and the silicon layer 101 is thinly formed on the surface of the $SiO_2$ layer 102 is produced. Non-Patent Document 1: Michel Bruel, "Smart-Cut: A New Silicon On Insulator Material Technology Based on Hydrogen Implantation and Wafer Bonding," Jpn. J. Appl. Phys., Vol. 36 (1997), pp. 1636 to 1641.

DISCLOSURE OF INVENTION

Problems to be Solved by the Invention

The present inventors found out that, by forming a hydrogen implanted layer inside a semiconductor substrate on which at least part of a semiconductor element, such as a MOS transistor, is formed and then separating part of the semiconductor substrate, the semiconductor element can be produced on another substrate to have a small thickness. Use of a transparent substrate for another substrate enables a semiconductor device whose semiconductor layer is a thin film to be applied to a liquid crystal display device.

However, as described later, when the hydrogen implanted layer is formed at an unidentical depth to be not planar, there is a problem that the thickness of a silicon layer, which is a base layer of the semiconductor device, is uneven.

As shown in FIG. 24, a surface of a silicon substrate 201 has a plurality of device isolation regions S in which a LOCOS oxide film 211 is formed and a plurality of active regions K formed between the device isolation regions S. In the active regions K, gate electrodes 212a and 212b of, for example, a MOS transistor are provided. The gate electrodes 212a and 212b are formed in different portions relatively distant from each other on the silicon substrate 201.

Next, as shown in FIG. 25, a $SiO_2$ layer 213 is deposited on the silicon substrate 201 by CVD, or the like, for planarizing the surface of the overall substrate, and then, the resultant surface is planarized by CMP (Chemical Mechanical Polishing). When hydrogen is implanted without this planarization step, the implanted hydrogen is quite uneven in depth. Consequently, the separation step for forming microcracks on the silicon substrate to separate part of the substrate is readily disturbed and it is thus difficult to produce devices including the MOS transistor and other elements on another substrate. The foregoing was confirmed through the experiments by the present inventors. Accordingly, the above-described planarization step can be regarded as being indispensable.

The surfaces of the active regions K in which the gate electrodes 212a and 212b are formed and the surfaces of the device isolation regions S in which the LOCOS oxide films 211 are formed have different heights, and thus undulations on the overall surface of the substrate are relatively large. Therefore, as shown by the phantom line (two-dot chain line) in FIG. 25, such undulations are also produced on the surface of the $SiO_2$ film 213 formed through the deposition in the active regions K and device isolation regions S. That is, there is a problem that high accuracy planarization by CMP on the surface of the $SiO_2$ film 213 having such undulations is limited.

To reduce the undulations of the surface of the deposited $SiO_2$ film 213 as small as possible, the $SiO_2$ film 213 needs to be formed so as to have a thickness of approximately 1 μm or more. However, with such a relatively large thickness the $SiO_2$ film 213 has, the average thickness of the $SiO_2$ film 213 readily varies among different regions over the silicon substrate 201 (the right and left regions in FIG. 25) as shown by the phantom line (two-dot chain line) in FIG. 25, and therefore, the planarization film 213 disadvantageously has variations in thickness after CMP.

Consequently, the thicknesses 214a and 214b, extending from the surface of the silicon substrate 201 facing the gate electrode 212a and 212b of the MOS transistor to the surface of the planarization film 213, are not equal among different regions over the silicon substrate 201.

When, with such circumstances, hydrogen 215 is implanted into the silicon substrate 201, hydrogen implanted layers 216a and 216b are formed in different regions in the silicon substrate 201 at different depths 217a and 217b from the surface of the silicon substrate 201 facing the gate electrodes 212a and 212b of the MOS transistor as shown in FIG. 26. When another substrate 220 is then subsequently bonded onto the surface of the planarization film 213 and the resultant structure is heated, part of the silicon substrate 201 is separated away along the hydrogen implanted layers 216a and 216b as shown by the phantom line (two-dot chain line) in FIG. 27. Accordingly, the thicknesses 217a and 217b of the silicon layer 201 immediately after the separation are not equal among the different regions.

Consequently, removing away part of the silicon layer 201 having a predetermined thickness by etching, or the like, at a later step for device isolation such that the LOCOS oxide film 211 is exposed would lead to generation of different thicknesses 218a and 218b of channel regions facing the gate electrodes 212a and 212b and hence cause differences in threshold currents and current-voltage characteristics among the MOS transistors. Also, application of the thus-produced semiconductor device to a liquid crystal display device inevitably would lead to deterioration in visual quality.

The present invention was conceived in view of these circumstances, and an objective of the present invention is to form a planarization film so as to have a uniform thickness so that the base layer where active regions are formed has a uniform thickness, and the reliability of a semiconductor device is improved.

Means for Solving the Problems

To achieve the above-described object, according to the present invention, a first planarization film is formed in at least part of a second region provided between first regions having active regions, and a second planarization film is formed between the first planarization films.

Specifically, the present invention provides a method for producing a semiconductor device that has a plurality of first regions in which active regions are formed on a base layer and second regions each provided between the first regions to form device isolation regions, the method including: a first planarization film formation step of forming, in at least part of a flat portion of the second regions, a first planarization film so as to have a flat surface and a uniform thickness; a second planarization film formation step of forming a second planarization film between the first planarization films to be coplanar with a surface of the first planarization film; a peeling layer formation step of forming a peeling layer by ion implantation of a peeling material into the base layer via the first planarization film or the second planarization film; and a separation step of separating part of the base layer along the peeling layer.

The second planarization film formation step preferably includes forming the first insulating film at least between the first planarization films so as to have a height higher than the surface of the first planarization film and polishing away part of the first insulating film using the first planarization film as a stopper, so that the surface of the first insulating film is coplanar with the surface of the first planarization film.

The first planarization film formation step preferably includes forming a second insulating film in the first region and the second region and subsequently removing the second insulating film at least from the first region, so that the second insulating film remains in at least part of the second regions, and the first planarization film includes the second insulating film remaining in the second region.

The first planarization film formation step may include forming the second insulating film as the first planarization film. In this case, the second insulating film is preferably a silicon nitride film, and the first insulating film is preferably a silicon oxide film.

An insulating film for device isolation may be formed in the device isolation region; the second insulating film may be formed of a same material as that of the insulating film for device isolation; and the first planarization film formation step may include forming a third insulating film of a material different from that of the second insulating film on the second insulating film remaining in the second region, so that the second insulating film and the third insulating film constitute the first planarization film. In this case, preferably, the first insulating film and the second insulating film are silicon oxide films, and the third insulating film is a silicon nitride film.

Preferably, the method further includes a gate electrode formation step of forming a gate electrode in the first region, wherein the first planarization film formation step includes forming the first planarization film so as to have a height higher than a surface of the gate electrode.

The method may further includes a bonding step of bonding a substrate onto the first planarization film and the second planarization film with an insulating film interposed therebetween, wherein the bonding step is performed prior to the separation step.

The substrate may be a glass substrate or silicon substrate.

The base layer is preferably any one of a silicon layer, a silicon carbide layer, a silicon germanium layer, a germanium layer, a gallium nitride layer, a gallium arsenic layer, an indium phosphide layer, a $LiNbO_3$ layer, a $LaAlO_3$ layer, and a $SrTiO_3$ layer.

Desirably, the peeling material is at least any one of hydrogen and an inert element.

The second planarization film formation step preferably includes planarizing the first insulating film by CMP (Chemical Mechanical Polishing).

In the first region, a MOS transistor may be formed.

Also, the present invention provides a semiconductor device including a plurality of first regions in which active regions are formed on a base layer and second regions each provided between the first regions to form device isolation regions, the semiconductor device further including: a first planarization film having a uniform thickness in at least part of a flat portion of the second regions; and a second planarization film between the first planarization films, the second planarization film having a surface coplanar with a surface of the first planarization film, wherein part of the base layer is separated along a peeling layer formed by ion implantation of a peeling material.

Preferably, a surface of the first planarization film opposite to the base layer is formed by a silicon nitride film; and a surface of the second planarization film opposite to the base layer is formed by a silicon oxide film.

Preferably, the semiconductor device further includes a substrate bonded to the first planarization film and the second planarization film.

The substrate is preferably a glass substrate or silicon substrate.

The base layer is preferably any one of a silicon layer, a silicon carbide layer, a silicon germanium layer, a germanium layer, a gallium nitride layer, a gallium arsenic layer, an indium phosphide layer, a LiNbO$_3$ layer, a LaAlO$_3$ layer, and a SrTiO$_3$ layer.

Desirably, the peeling material is at least any one of hydrogen and an inert element.

The semiconductor device may further include a MOS transistor in the first region.

—Functions—

Hereinafter, functions of the present invention are described.

A semiconductor device according to the present invention has, for example, a plurality of first regions in which MOS transistors are formed and second regions that are each provided between the first regions. In the first regions, for example, active regions are formed in a base layer, which is a silicon layer or the like. In the second regions, device isolation regions are formed. The base layer may be any one of a silicon layer, a silicon carbide layer, a silicon germanium layer, a germanium layer, a gallium nitride layer, a gallium arsenic layer, an indium phosphide layer, a LiNbO$_3$ layer, a LaAlO$_3$ layer, and a SrTiO$_3$ layer.

When producing such a semiconductor device, a first planarization film formation step, a second planarization film formation step, a peeling layer formation step, and a separation step are performed.

In the first planarization film formation step, a first planarization film having a flat surface is formed in at least part of a flat portion of the second regions so as to have a uniform thickness. For example, first, a second insulating film is formed in the first region and the second region. When a gate electrode is formed in the first region, the first planarization film is formed to have a height higher than that of the surface of the gate electrode. Thereafter, a second insulating film is removed from at least the first region so that a second insulating film remains in at least part of a flat portion of the second regions. The first planarization film is formed so as to include the second insulating film remaining in the second region.

The first planarization film has a relatively small thickness regardless of the undulations of the first region since the first planarization film is formed in the flat second region. Accordingly, in each region of the semiconductor device, the thickness of the first planarization film hardly becomes uneven. Also, a polishing process, such as CMP, is unnecessary and, therefore, the first planarization film can readily and accurately be formed to be flat.

In the first planarization film formation step, a second insulating film, such as a silicon nitride film, may be formed as the first planarization film. In this case, the second planarization film is formed of a first insulating film, such as a silicon oxide film.

Also, in the first planarization film formation step, a second insulating film may be formed of a silicon oxide film, or the like, of the same material as that of the insulating film for device isolation in the device isolation region, and a third insulating film different from the second insulating film, such as a silicon nitride film, may be formed over the second insulating film remaining in the second region. In this structure, a second insulating film and a third insulating film in the second region constitute the first planarization film. In this case, the first insulating film formed at a later step is preferably a silicon oxide film.

In the second planarization film formation step, the second planarization film having a flat surface coplanar with the surface of the first planarization film is formed between the first planarization films. Specifically, the first insulating film is formed at least between the first planarization films 13 so as to have a height higher than the surface of the first planarization film, and part of the first insulating film is polished away by CMP, or the like, using the first planarization film of a uniform thickness as a stopper. Thereby, the surface of the first insulating film can be planarized so as to be coplanar with the surface of the first planarization film. Thus, the surface of the first planarization film opposite to the base layer is a silicon nitride film, and the surface of the second planarization film opposite to the base layer is a silicon oxide film.

In the peeling layer formation step, a peeling material that is at least any one of hydrogen and the inert element is ion-implanted into the base layer via the first planarization film or the second planarization film to form the peeling layer. As described above, when the first planarization film includes an insulating film of the same material as that of the insulating film for device isolation, the same material is used, if possible, for a layer or film through which ions pass so that the peeling layer is uniformly formed at the same depth.

In the case of performing the bonding step, a glass substrate or silicon substrate, for example, is bonded onto the first planarization film and the second planarization film with the insulating film interposed therebetween. Thereafter, in the separation step, part of the base layer is separated along the peeling layer. Consequently, the first planarization film and the second planarization film are formed to have an identical thickness even though they are in separate regions. Therefore, the thickness of the base layer where the active regions are formed is uniform, and the reliability of the semiconductor device is improved.

Effects of the Invention

According to the present invention, a first planarization film is formed in at least part of a flat portion of a second region provided between first regions having active regions, and a second planarization film is formed between the first planarization films. Therefore, the first planarization film can be formed so as to have a uniform thickness, and the second planarization film can accordingly be planarized with high accuracy as well as the first planarization film. Consequently, the thickness of the base layer where the active regions are formed is made even to improve the reliability of a semiconductor device.

DESCRIPTION OF REFERENCE NUMERALS

Figure 1:
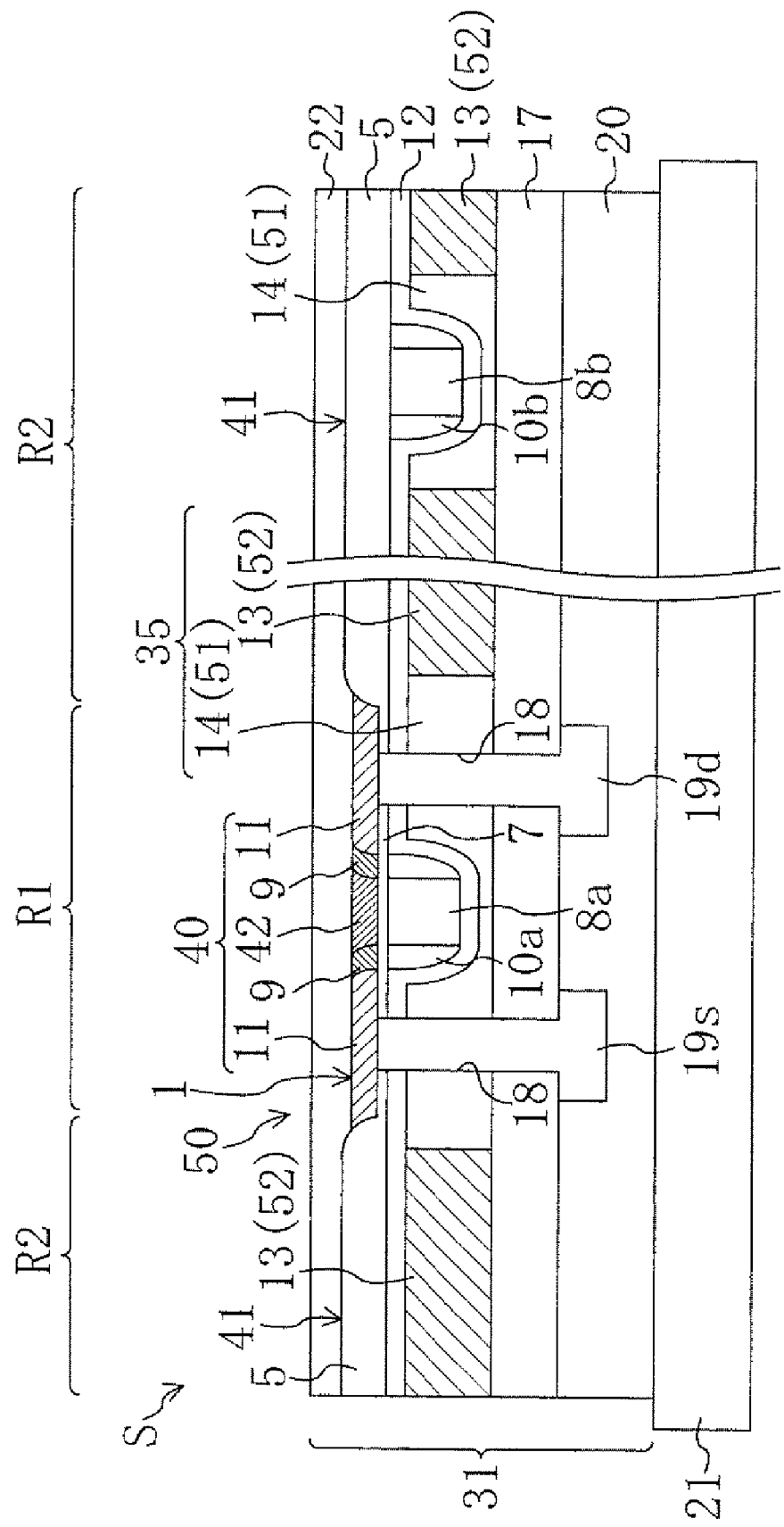
FIG. 1 is a sectional diagram schematically illustrating a structure of a semiconductor device according to Embodiment 1.

S Semiconductor device
R1 First region
R2 Second region
1 Base layer, Silicon substrate, Silicon layer
5 LOCOS oxide film (Insulating film for device isolation)
8a Gate electrode
13 First planarization film
14 Second planarization film
16 Peeling layer
17 Interlayer insulating film
20 Insulating film
21 Glass substrate
35 Planarization film
36 Trench
40 Active region
41 Device isolation region
42 Channel region
50 NMOS transistor
51 First insulating film
52 Second insulating film
53 Third insulating film

BEST MODE FOR CARRYING OUT THE INVENTION

Hereinafter, embodiments of the present invention are described with reference to the drawings. The present invention is not limited to these embodiments. In the embodiments, a base layer 1 is sometimes referred to as a silicon substrate 1 or a silicon layer 1.

Embodiment 1 of the Invention

FIG. 1 to FIG. 12 are sectional diagrams illustrating Embodiment 1 of a semiconductor device and method for producing the same according to the present invention.

In the present embodiment, for clear and quick understanding, regions of the semiconductor device S in which an NMOS transistor 50 is included are described. A PMOS transistor, which is not shown here, can be formed in basically the same way as in the case of the NMOS transistor 50 by properly changing the impurity conductivity-type at the ion implantation step. The semiconductor device S has a plurality of the NMOS transistors 50 and PMOS transistors formed over a single semiconductor substrate.

For example, although not shown, the semiconductor device S is directly formed on a glass substrate which is a constituent of a display panel of a liquid crystal display device and is applicable to a driver for driving and controlling a plurality of pixels of the display panel.

FIG. 1 is a sectional diagram schematically illustrating the semiconductor device S. The semiconductor device S includes a glass substrate 21, and a semiconductor device part 31 formed in high density and with high accuracy on the glass substrate 21. The semiconductor device part 31 includes the transistor 50.

When the semiconductor device S is applied to a liquid crystal display device, the substrate 21 is preferably a transparent substrate, such as a glass substrate 21. When applied to a device other than a liquid crystal display device, the substrate 21 may be a substrate of a different type, such as a silicon substrate.

The semiconductor device part 31 has a plurality of first regions R1 that include active regions 40 (only one of the first regions is shown in FIG. 1) and second regions R2 that are each provided between the first regions R1. The first region R1 includes the NMOS transistor 50, which is a semiconductor element. The second region R2 includes a device isolation region 41 for electric separation of the transistors 50. The device isolation region 41 includes a LOCOS oxide film 5, which is a film for device isolation.

The active region 40 is provided on a base layer 1 and has an LDD (Lightly Doped Drain) structure formed by low-concentration impurity regions 9 provided on both sides of a channel region 42 and high-concentration impurity regions 11 provided on both sides of the low-concentration impurity regions 9. The base layer 1 is, for example, a semiconductor layer such as a silicon layer. The base layer 1 may be, as well as the silicon layer, any one of a silicon carbide layer, a silicon germanium layer, a germanium layer, a gallium nitride layer, a gallium arsenic layer, an indium phosphide layer, a $LiNbO_3$ layer, a $LaAlO_3$ layer, and a $SrTiO_3$ layer.

Part of the base layer 1 is separated away along the peeling layer formed by ion implantation of a material for peeling, such as hydrogen, which will be described later. The peeling material may be at least any one of hydrogen and an inert element, such as helium, neon, argon, and krypton. Also, since the base layer 1 excluding the active regions 40 is removed by polishing, the active regions 40 serve as the base layer 1. The base layer 1 excluding the active regions 40 may be left on the side of the active regions 40 opposite to the glass substrate 21.

Referring to FIG. 1, an insulating film 20 is provided over the surface of the glass substrate 21. On the insulating film 20, an interlayer insulating film 17, a planarization film 35, and an interlayer insulating film 12 are provided in this order. Further, on the interlayer insulating film 12, a gate oxide film 7 is provided in the first region R1, and the LOCOS oxide film 5 is provided in the second region R2.

A surface of the LOCOS oxide film 5 on the glass substrate 21 side (i.e., closer to the glass substrate 21 than the other surface is) is coplanar with a surface of the gate oxide film 7 on the glass substrate 21 side. On the gate oxide film 7, the active regions 40 are provided. The active regions 40 and LOCOS oxide films 5 are covered with a protective film 22 for protecting the surfaces thereof.

The second region R2 includes a gate wiring layer 8b and sidewalls 10b between the interlayer insulating film 12 and the gate oxide film 7. The planarization film 35 in the second region R2 partially has a depression in the shape of "U" and, in the depression, the gate wiring layer 8b and sidewalls 10b are provided with the interlayer insulating film 12 interposed between the planarization film 35 and the gate wiring layer 8b and sidewalls 10b.

The first region R1 includes a gate electrode 8a and sidewalls 10a between the interlayer insulating film 12 and the gate oxide film 7. The planarization film 35 in the first region R1 also partially has a depression in the shape of "U" and, in the depression, the gate electrode 8a and sidewalls 10a are provided with the interlayer insulating film 12 interposed between the planarization film 35 and the gate electrode 8a and sidewalls 10a. The gate electrode 8a faces the channel region 42 with the gate oxide film 7 interposed therebetween. The sidewall 10a faces the low-concentration impurity region 9 with the gate oxide film 7 interposed therebetween.

Contact holes 18s and 18d pass through the interlayer insulating film 17, the planarization film 35, the interlayer insulating film 12, and the gate oxide film 7 at positions vertically corresponding to the high-concentration impurity regions 11. The contact holes 18s and 18d are respectively filled with a source electrode 19s and a drain electrode 19d that are metal electrodes.

A unique feature of the present invention is that the planarization film 35 is formed by a first planarization film 13, which has an equal thickness in at least part of a flat portion of the second region R2, and a second planarization film 14 provided between the first planarization films 13. The second planarization film 14 has a flat surface that is coplanar with the surface of the first planarization film 13.

Referring to FIG. 1, in the second region R2, the surface of the LOCOS oxide film 5 on the glass substrate 21 side is flat and, therefore, the surface of the interlayer insulating film 12 on the glass substrate 21 side is also flat. That is, in part of the second region R2 not including the components such as the gate wiring layer 8b and sidewalls 10b, the surface of the interlayer insulating film 12 on the glass substrate 21 side is flat. Thus, the first planarization film 13 is provided only in the flat region of the second region R2 facing the LOCOS oxide film 5. With such a structure, the surface of the first planarization film 13 on the glass substrate 21 side requires no polishing processes like CMP (Chemical Mechanical Polishing) and readily and accurately obtains a flat surface by means of deposition, or the like. Also, the surface of the first planarization film 13 on the glass substrate 21 side is closer to the glass substrate 21 than the gate electrode 8a and gate wiring layer 8b are.

The second planarization films 14 are provided in the first region R1 and in at least part of the second region R2 including the components such as the gate wiring layer 8b and sidewalls 10b. The second planarization film 14 occupies the spaces between the first regions R1. The surface of the second planarization film 14 on the glass substrate 21 side is coplanar with the surface of the first planarization film 13 on the glass substrate 21 side. Thus, the second planarization film 14 and the first planarization film 13 constitute the planarization film 35 for obtaining a flat surface over the first region R1 and the second region R2.

That is, the overall first planarization film 13 is formed of a silicon nitride film and the overall second planarization film 14 is formed of a silicon oxide film. The surface of the first planarization film 13 on the side opposite to the base layer 1 (i.e. the surface on the glass substrate 21 side) is formed of a silicon nitride film. The surface of the second planarization film 14 on the side opposite to the base layer 1 is formed of a silicon oxide film.

—Production Method—

Next, a method for producing the semiconductor device S according to the present invention is described.

The production method according to the present embodiment includes a trench formation step, a LOCOS oxide film formation step, an ion implantation step, a gate electrode formation step, a gate wiring layer formation step, an activation step, a first planarization film formation step, a second planarization film formation step, a peeling layer formation step, a conductive part formation step, a planarization step, a bonding step, and a separation step.

Figure 2:
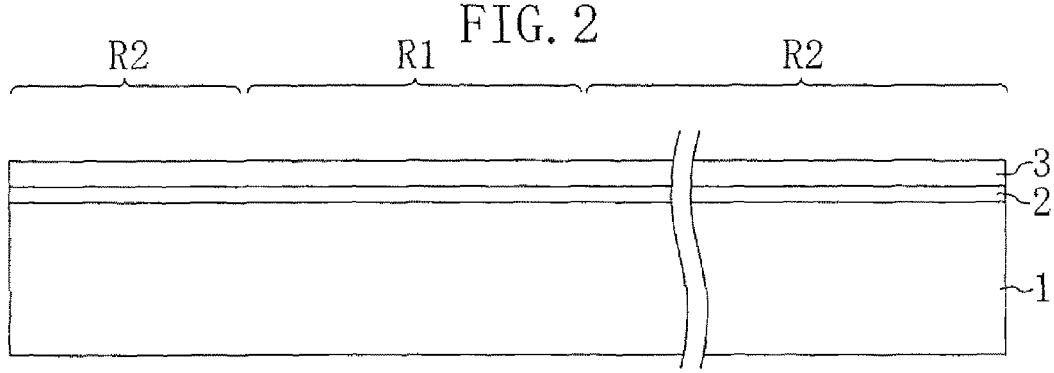
FIG. 2 is a sectional diagram illustrating the trench formation step where a nitride film is formed.
Figure 3:
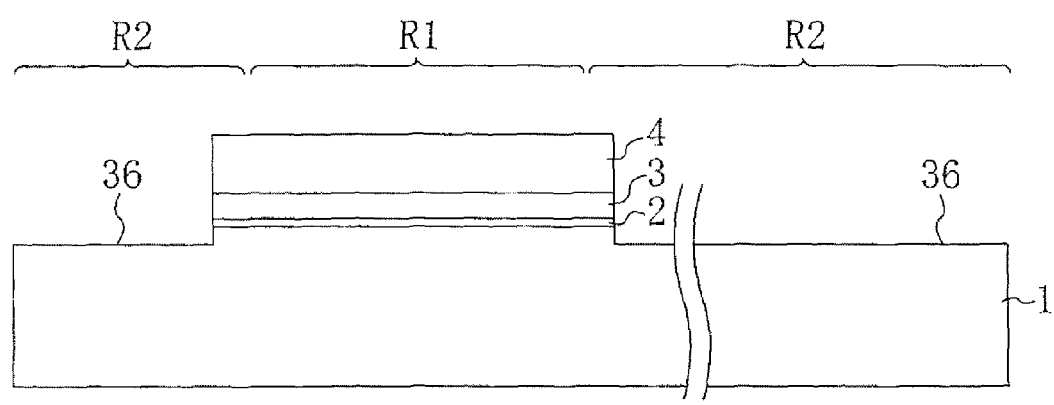
FIG. 3 is a sectional diagram illustrating the trench formation step where a trench is formed.

First, in the trench formation step, trenches 36 are formed in advance in the surface of the silicon substrate 1 in the second region R2 as shown in FIG. 3. Referring to FIG. 2, formation of the trench 36 first includes performing a high temperature heat treatment in an oxygen atmosphere at approximately 1000° C. on the wafer silicon substrate 1 (corresponding to the base layer 1 at later steps) to form a thermal oxide film 2 having a thickness of approximately 30 nm. Subsequently, a silicon nitride film 3 having a thickness of approximately 200 nm is formed by CVD, or the like.

Thereafter, referring to FIG. 3, in order to form the LOCOS oxide film 5 described later, the silicon nitride film 3 and thermal oxide film 2 are patterned using a resist 4 as a mask, and the silicon substrate 1 is etched to the depth of approximately 80 nm to form the trench 36. That is, the first region R1 of the silicon substrate 1 is masked so as not to be etched while the second region R2 of the silicon substrate 1 is etched away.

Figure 4:
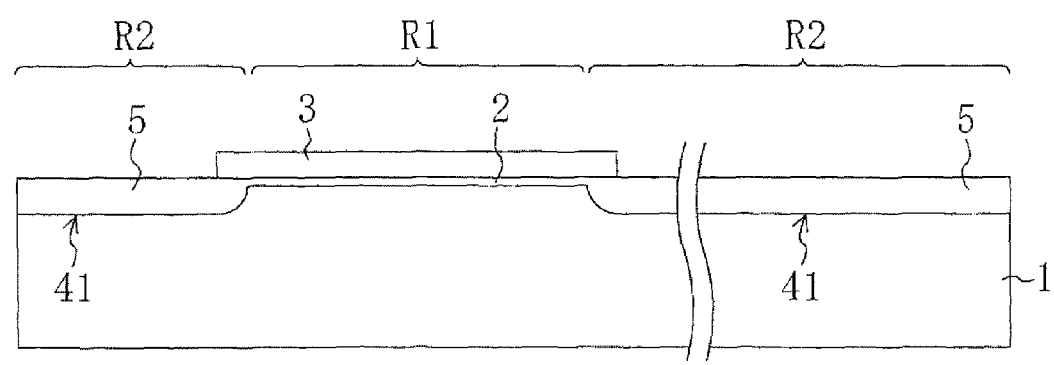
FIG. 4 is a sectional diagram illustrating the LOCOS oxide film formation step.
Figure 5:
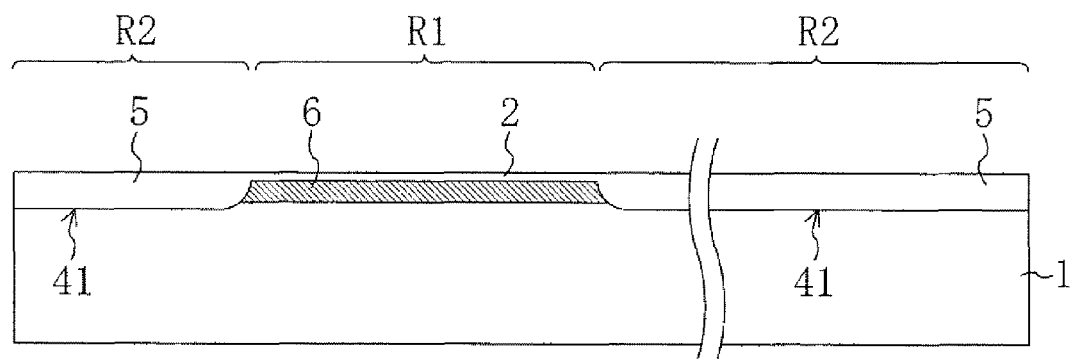
FIG. 5 is a sectional diagram illustrating the first ion implantation step.
Figure 6:
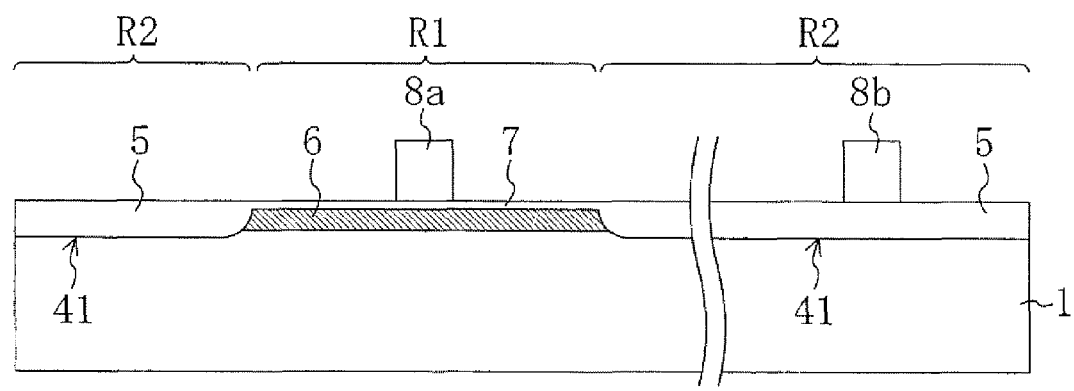
FIG. 6 is a sectional diagram illustrating the gate electrode formation step and the gate wiring layer formation step.
Figure 7:
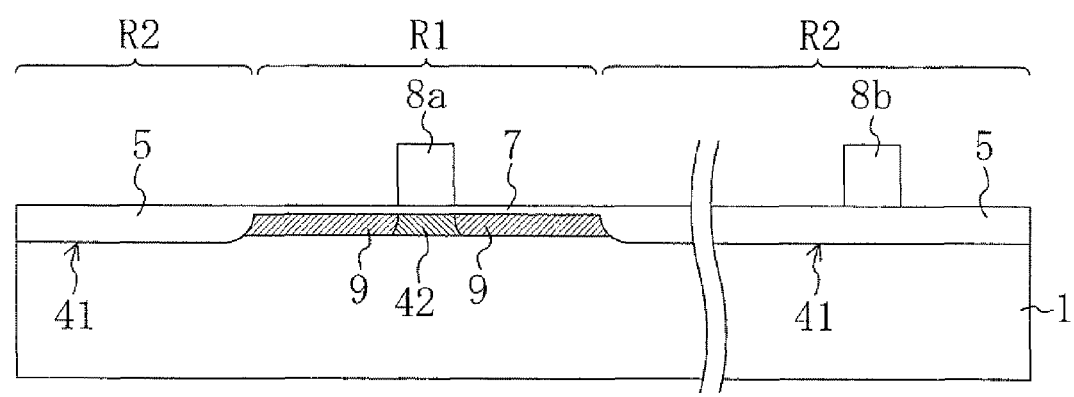
FIG. 7 is a sectional diagram illustrating the second ion implantation step.
Figure 8:
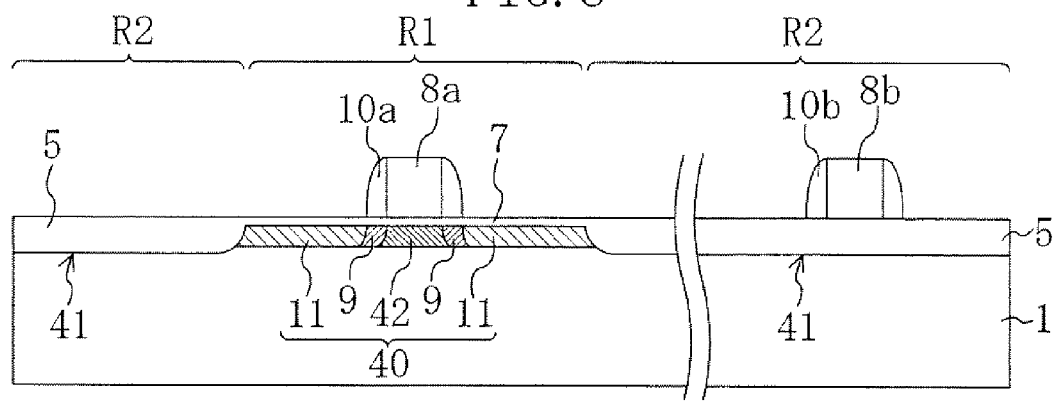
FIG. 8 is a sectional diagram illustrating the third ion implantation step.

Next, in the LOCOS oxide film formation step, the LOCOS oxide film 5, which is an insulating film for device isolation, is formed in the trench 36 by a LOCOS technique to the same height as the surface of the thermal oxide film 2 (the surface of the gate oxide film 7 formed later) as shown in FIG. 4. Specifically, after removal of the resist 4, thermal oxidation is carried out through a high temperature heat treatment in an oxygen atmosphere using the silicon nitride film 3 as a mask. Thereby, the LOCOS oxide film 5 is formed to have a thickness of approximately 200 to 500 nm. The thickness of the silicon layer 1 consumed by the oxidation is approximately 45% of the thickness of the LOCOS oxide film 5. Therefore, for example, when the thickness of the LOCOS oxide film 5 to be formed is 200 nm, the surface of the LOCOS oxide film 5 reaches at generally the same level as the surface of the thermal oxide film 2 by controlling the etching amount so that the depth of the trench 36 is 80 nm.

Subsequently, the first ion implantation step is performed. In this step, referring to FIG. 5, after removal of the silicon nitride film 3 by means of wet etching, or the like, an impurity element 6 is introduced by ion implantation, or the like, into predetermined regions of the silicon substrate 1 which are supposed to be the active regions 40 of the NMOS transistor 50 in order to adjust the threshold voltage of the NMOS transistor 50. For example, the impurity element may be boron. The implantation energy is approximately 10 to 30 KeV, and the dose is approximately $1\times10^{12}$ cm$^{-2}$ to $5\times10^{12}$ cm$^{-2}$.

Next, the gate electrode formation step and gate wiring layer formation step are performed. In these steps, referring to FIG. 6, the gate electrode 8a of the NMOS transistor is formed on the surface of the gate oxide film 7 in the first region R1, and the gate wiring layer 8b which is to be connected to the gate electrode 8a of the MOS transistor is formed on the LOCOS oxide film 5.

Specifically, the thermal oxide film 2 on the NMOS transistor formation region (the active region 40 at later steps) is removed by wet etching, or the like, and the resultant structure is then heated to approximately 1000° C. in an oxygen atmosphere to form a gate oxide film 7 on the silicon substrate 1 so as to have a thickness of approximately 10 to 20 nm. As a result, the surfaces of the gate oxide film 7 and LOCOS oxide film 5 are at generally the same level.

Subsequently, polysilicon is deposited on the surfaces of the gate oxide film 7 and LOCOS oxide film 5 by CVD, or the like, so as to have a thickness of approximately 300 nm. An N-type impurity, such as phosphorus, is diffused throughout, or introduced by ion implantation, or the like, into, this polysilicon layer to form an N-type polysilicon layer. Next, a photographic step and an etching step are performed on the N-type polysilicon layer, such that a patterned gate electrode 8a is formed on the gate oxide film 7, while a patterned gate wiring layer 8b is formed on the LOCOS oxide film 5. The gate electrode 8a and gate wiring layer 8b are formed concurrently. Also, the surfaces of the gate oxide film 7 and LOCOS oxide film 5 are at generally the same height, and therefore, the gate electrode 8a and gate wiring layer 8b can have the same height.

Next, the second ion implantation step is performed. In this step, referring to FIG. 7, after the resist (not shown) that has an opening at least above the NMOS transistor formation region (active region 40) is formed, the N-type impurity is ion-implanted using the gate electrode 8a as a mask. As a result, the low-concentration impurity region 9 is formed. The N-type impurity may be, for example, phosphorus, and the ion implantation is carried out under the condition that the dose is, for example, approximately $1\times10^{12}$ to $1\times10^{13}$ cm$^{-2}$.

Next, the third ion implantation step is performed. In this step, after the above-described resist (not shown) is removed, a SiO$_2$ film is deposited by CVD, or the like, in the first region R1 and the second region R2. Subsequently, referring to FIG. 8, an anisotropic etching is performed to form sidewalls 10a and 10b of SiO$_2$, or the like, over the side walls of the gate electrode 8a and gate wiring layer 8b. After the resist (not shown) that has an opening at least above the NMOS transistor formation region (the active region 40 at later steps) is formed, an N-type impurity is ion-implanted using the gate electrode 8a and sidewalls 10a as masks. As a result, the high-concentration impurity regions 11 are formed.

Figure 9:
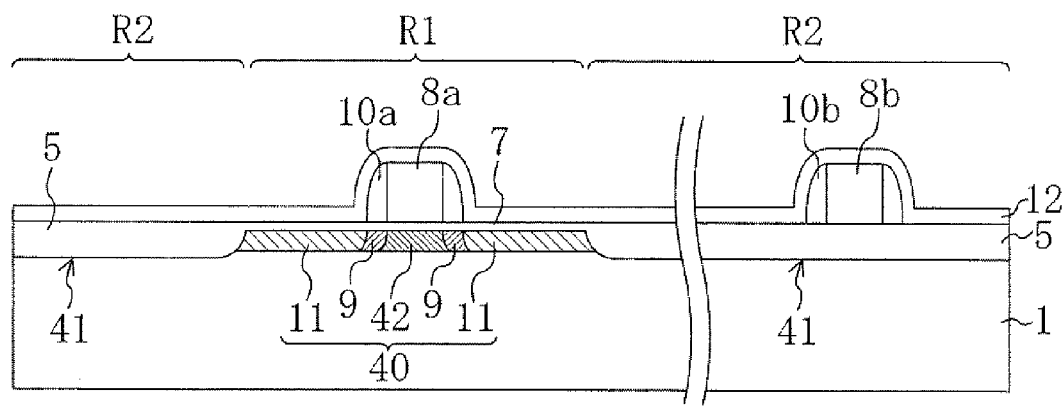
FIG. 9 is a sectional diagram illustrating the activation step.
Figure 10:
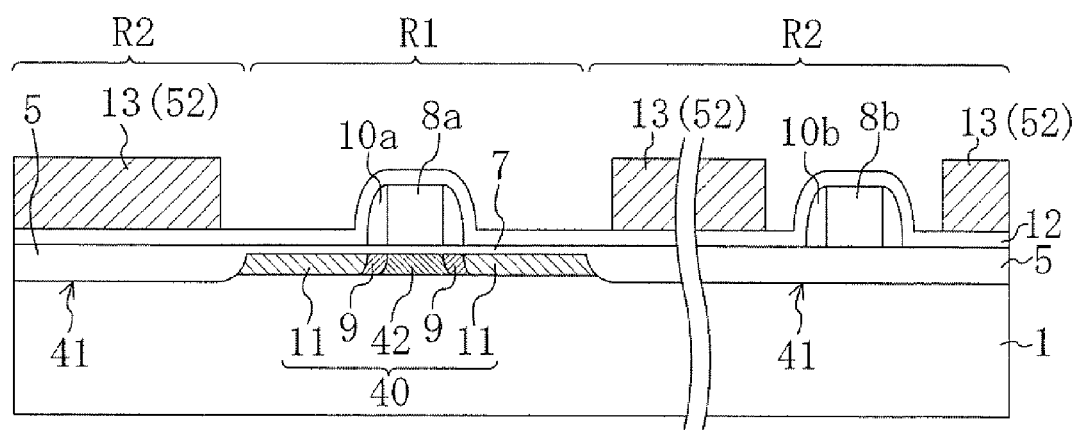
FIG. 10 is a sectional diagram illustrating the first planarization film formation step.

In the activation step subsequently performed, referring to FIG. 9, after an interlayer insulating film 12 is formed so as to have a thickness of approximately 100 nm so that the interlayer insulating film 12 covers the gate electrode 8a and gate wiring layer 8b, the impurity element introduced into the silicon substrate 1 by ion implantation, or the like, is activated by heating. The heating is carried out, for example, for 10 minutes at 900° C. As a result, an active region 40 is formed.

Next, the first planarization film formation step is performed. In this step, referring to FIG. 10, a first planarization film 13 having a flat surface is formed in at least part of a flat portion of the second regions R2 so as to have a uniform thickness.

Specifically, a second insulating film 52 is deposited on the surface of the interlayer insulating film 12 in the first region R1 and the second region R2 so as to have a height higher than that of the interlayer insulating film 12 facing the gate electrode 8a and gate wiring layer 8b (i.e. so as to be higher than the upper surface of the gate electrode 8a). Subsequently, the second insulating film 52 is removed at least from the first regions R1 to expose the interlayer insulating film 12. Furthermore, the second insulating film 52 is removed at least from the regions of the second region R2 in which the gate wiring layers 8b and sidewalls 10b are provided. Thus, the second insulating film 52 is left in at least part of a flat portion of the second regions R2 facing the LOCOS oxide film 5, and the resultant second insulating film 52 constitutes the first planarization films 13. That is, the first planarization film 13 includes the second insulating film 52 left in the second region R2. The second insulating film 52 (the first planarization film 13) may be a silicon nitride film whose selection ratio to the silicon oxide film is large.

Next, the second planarization film formation step is performed. In this step, referring to FIG. 11, the second planarization film 14 having a flat surface which is coplanar with the surface of the first planarization film 13 is formed between the first planarization films 13.

Specifically, a first insulating film 51 is deposited in the first regions R1 and the second regions R2 (at least between the first planarization films 13) so as to reach a level equal to or higher than the surface of the first planarization film 13, and then, part of the first insulating film 51 is polished away by CMP, or the like, using the first planarization film 13 as a stopper. The first insulating film 51 may be a silicon oxide film. In the CMP process, to obtain a high selectivity to the silicon nitride film of the second insulating film 52, a slurry containing cerium oxide (CeO$_2$) as abrasive grains is preferably employed.

Figure 11:
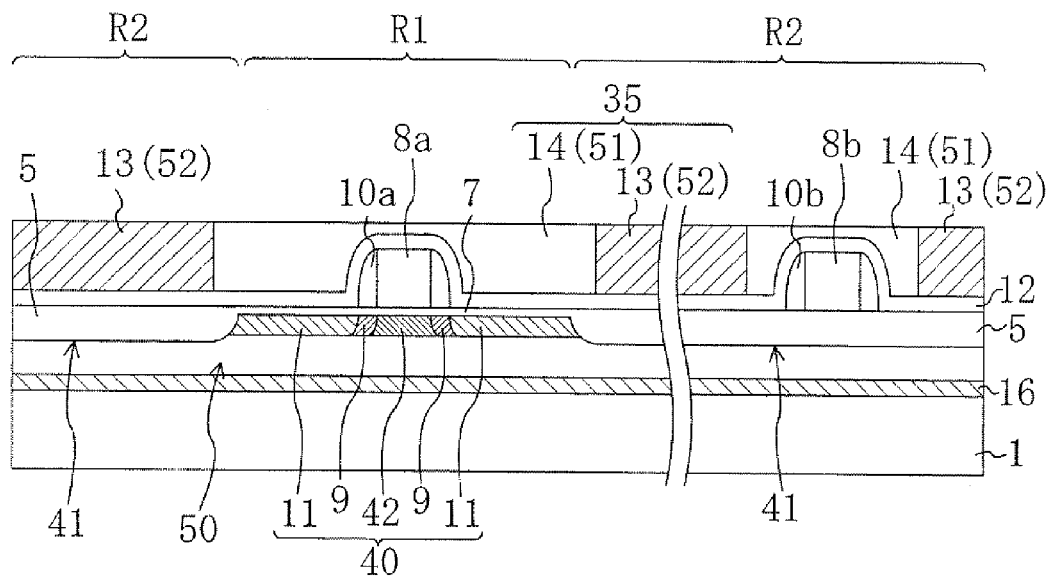
FIG. 11 is a sectional diagram illustrating the second planarization film formation step and the peeling layer formation step.

Due to the stopper, the CMP process of the first insulating film 51 stops at the timing when the second insulating film 52 (silicon nitride film) is exposed and, as shown in FIG. 11, the surface of the remaining first insulating film 51 is coplanar with the surface of the first planarization film 13 (the second insulating film 52). Consequently, the whole first planarization film 13 and second planarization film 14 constitute a planarization film 35, so that the distance 15 from the surface of the silicon substrate 1 facing the gate electrode 8a to the surface of the first planarization film 13 (the surface opposite to the silicon substrate 1) can be uniform over a plurality of the first regions R1.

Subsequently, in the peeling layer formation step, referring to FIG. 11, hydrogen, which is a peeling material, is ion-implanted into the silicon substrate 1 (i.e. the base layer 1) via the first planarization film 13 or second planarization film 14 (i.e. the planarization film 35) to form a peeling layer 16. The ion implantation is carried out under the condition that the dose is, for example, approximately $2\times10^{16}$ to $1\times10^{17}$ cm$^{-2}$, and the implantation energy is approximately 100 to 200 KeV. Any other element than hydrogen may also be introduced together with hydrogen.

Since the gate electrode 8a and gate wiring layer 8b are formed on the same plane having an uniform height, the planarization film 35 can be made relatively thin and the peeling layer 16, which is the hydrogen implanted layer, can be relatively shallow. Accordingly, the depth of the ion implantation varies little, and it is possible to perform the relatively accurate ion implantation to a predetermined depth from the surface of the planarization film 35.

Figure 12:
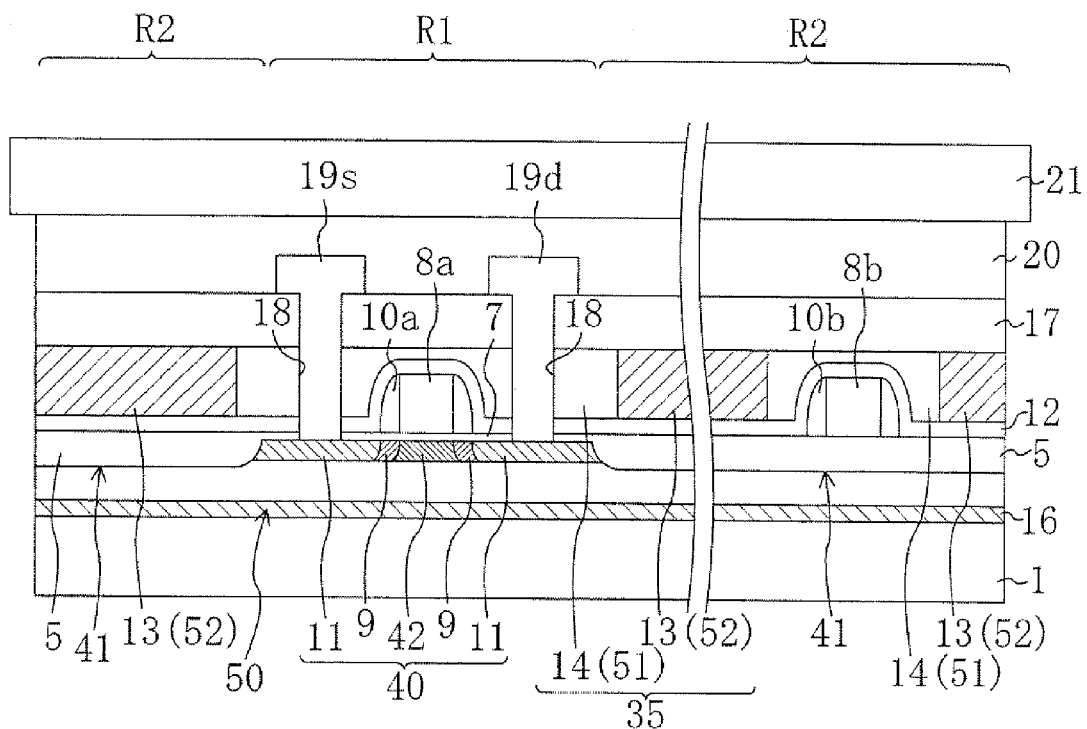
FIG. 12 is a sectional diagram illustrating the conductive part formation step, the planarization film formation step, and the bonding step.

Thereafter, in the conductive part formation step, referring to FIG. 12, a source electrode 19s and drain electrode 19d as conductive parts which are to be connected to the source region or drain region of a MOS transistor are formed. That is, referring to FIG. 12, an interlayer insulating film 17 is formed on the surface of the planarization film 35. Also, above the drain region and source region of the active region 40, contact holes 18d and 18s are formed so as to vertically penetrate through the gate oxide film 7, the interlayer insulating film 12, the first planarization film 13, and the interlayer insulating film 17. Then, a conductive material, such as a metal, is deposited and patterned so that the contact hole 18 is filled with the conductive material, and the source electrode 19s and drain electrode 19d are formed.

Then, in the planarization step, referring to FIG. 12, after the insulating film 20 is deposited on the interlayer insulating film 17 in the first region R1 and the second region R2, the surface of the insulating film 20 is planarized by CMP, or the like. Subsequently, in the bonding step, the glass substrate 21 is bonded to the planarization film 35 with the interlayer insulating film 17 and insulating film 20 interposed therebetween. Specifically, the surface of the insulating film 20 is cleaned by the RCA cleaning, or the like, and then, the glass substrate 21 is bonded onto the surface of the insulating film 20.

Then, in the separation step, the silicon substrate 1 is heated to 600° C., whereby part of the silicon substrate 1 (i.e. the portion of the silicon substrate 1 opposite to active region 40 with respect to the peeling layer 16) is separated away along the peeling layer 16. Consequently, the remaining part of the silicon substrate 1 is left on the glass substrate 21 as the silicon layer 1, which is the base layer 1, and this means that the semiconductor device part 31 formed on the silicon substrate 1 has been transferred onto the glass substrate 21.

Thereafter, the part of the silicon layer 1 including hydrogen (i.e. part of the peeling layer 16) is removed by etching, or the like. The etching may be dry etching, wet etching, or a combination thereof. However, since sole use of dry etching could cause etching damage to be left on the surface of the silicon layer 1, a suitable wet etching process is preferably performed after the dry etching. By etching the silicon layer 1 until the LOCOS oxide film 5 is exposed, the device isolation may also be performed concurrently in this step. Consequently, referring to FIG. 1, only the silicon layer 1 where the active region 40 is formed is left in the first region R1. Subsequently, in order to protect the surface of the silicon layer 1 from which hydrogen has been removed, a protective film 22, such as an oxide film, or the like, is formed. Thus, the semiconductor device S is produced.

—Effects of Embodiment 1—

In the first regions R1, the gate electrode 8a and other relevant elements are projecting from the surface of the gate oxide film 7 and, therefore, the first regions R1 have large undulations as a whole. In the second regions R2, the gate wiring layer 8b and other relevant elements are projecting from the surface of the LOCOS oxide film 5 and, therefore, the second regions R2 have large undulations as a whole although the surface of the LOCOS oxide film 5 is flat. Accordingly, if it were attempted to deposit an insulating film in the overall first region R1 and the second region R2 and then planarize the insulating film at a time by CMP, it would be necessary to deposit a relatively thick insulating film over the overall first region R1 and the second region R2 so that the undulations over the surface are made as small as possible. However, there is a limit in planarizing an insulating film having such undulations by CMP with high accuracy. Also, if the insulating film were relatively thick, the respective different regions on the silicon substrate 1 would be likely to have varying average thicknesses of the deposited insulating film, and as a result, it would be inevitable that the thickness of the film planarized by CMP is uneven.

In contrast, in the present embodiment, the first planarization film 13 and the second planarization film 14 constitute the planarization film 35. The first planarization film 13 is first formed on a flat surface on the LOCOS oxide film 5 in the second region R2 (i.e. a surface in the second region R2 where the gate wiring layer 8b and other relevant elements are not formed). Thus, despite the large undulations of the first region R1, it is possible to form the first planarization film 13 that is relatively thin but has a sufficient thickness to reach a level higher than the gate electrode 8a and other relevant elements. Accordingly, simply by depositing the second insulating film 52, which is, for example, a silicon nitride film, on the surface of the interlayer insulating film 12 without CMP, it is possible to readily form the flat surface of the second insulating film 52 with superior accuracy. In addition, since the thickness of the second insulating film 52 itself is relatively small and less varying, the first planarization film 13 can be formed to have a uniform thickness and flat surface.

Also, the second planarization film 14 is formed by depositing the first insulating film 51, for example, a silicon oxide film, in the first region R1 and the second region R2 so as to be higher than the surface of the first planarization film 13 and polishing part of the first insulating film 51 on the exposed side by CMP. Thus, the first planarization film 13 accurately planarized can serve as a polishing stopper for the first insulating film 51. Consequently, the second planarization film 14 can be coplanar with the surface of the first planarization film 13 and thus, as a whole, the planarization film 35 having a uniform thickness and a surface planarized with high accuracy can be formed.

By ion-implanting hydrogen via the planarization film 35, the hydrogen implantation depth in the silicon substrate 1 can be prevented from varying, and the peeling layer can be formed at a predetermined depth in the silicon substrate 1 with high accuracy. Then, the heating is performed to separate away part of the silicon substrate 1 along the peeling layer so that the thickness of the remaining part of the silicon substrate 1 (i.e. the base layer 1) is uniform over the first regions R1 in which the active regions 40 are formed. That is, it is possible to improve the controllability of the thickness of the base layer 1. Thus, the thickness of the channel region 42 of the base layer 1 subsequently polished is uniform in each of the first regions R1, and the NMOS transistors 50 have equal threshold voltages and equal current-voltage characteristics. Accordingly, it is possible to improve the reliability of the semiconductor device S. Also, when the semiconductor device S is applied to a liquid crystal display device, the display quality of the liquid crystal display device can be improved.

Embodiment 2 of the Invention

Figure 13:
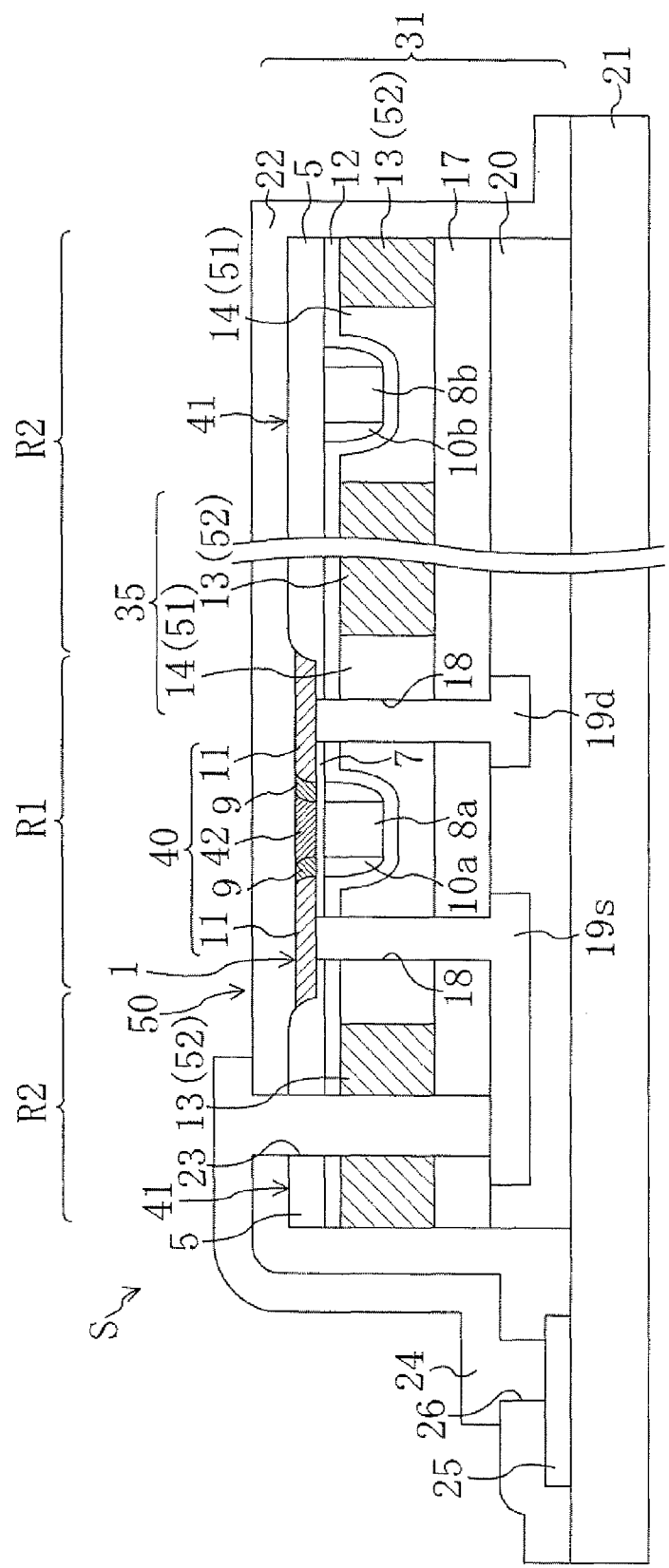
FIG. 13 is a sectional diagram schematically illustrating a structure of a semiconductor device according to Embodiment 2.

FIG. 13 is a sectional diagram illustrating Embodiment 2 of the semiconductor device S according to the present invention. In the embodiments described hereinafter, the same elements as those illustrated in FIG. 1 to FIG. 12 are denoted by the same reference numerals, and the detailed descriptions thereof are omitted.

In the present embodiment, the semiconductor device S is connected to an electric element 25 previously formed on a glass substrate 21.

As shown in FIG. 13, the electric element 25 is provided on the glass substrate 21. The electric element 25 may be, for example, an active element, such as a thin film transistor, a passive element, such as a resistance element, a coil element or a capacitive element, or a wiring. Also, a semiconductor device part 31 is formed on the glass substrate 21 as basically equivalent to that of Embodiment 1.

In the present embodiment, a protective film 22 covers the overall semiconductor device part 31 as well as the glass substrate 21 and the electric element 25 provided around the semiconductor device part 31. The semiconductor device part 31 has a contact hole 23, above a source electrode 19s, which vertically penetrates through an interlayer insulating film 17, a first planarization film 13, an interlayer insulating film 12, a LOCOS oxide film 5, and the protective film 22. The protective film 22 on the electric element 25 has a contact hole 26 penetrating through the protective film 22.

The source electrode 19s and the electric element 25 are connected together via a metal wire electrode 24. That is, the metal wire electrode 24 is patterned to fill the contact holes 23 and 26 and connect the openings of the contact holes 23 and 26 together. With this structure, for example, a source signal is supplied from the electric element 25 to a source region 11 of an active region 40 via the metal wire electrode 24 and the source electrode 19s.

Embodiment 3 of the Invention

FIG. 14 to FIG. 18 are sectional diagrams illustrating Embodiment 2 of the semiconductor device S according to the present invention. The present embodiment is different from Embodiment 1 in that a first planarization film 13 and a second planarization film 14 are each constituted of two different insulating films.

Figure 14:
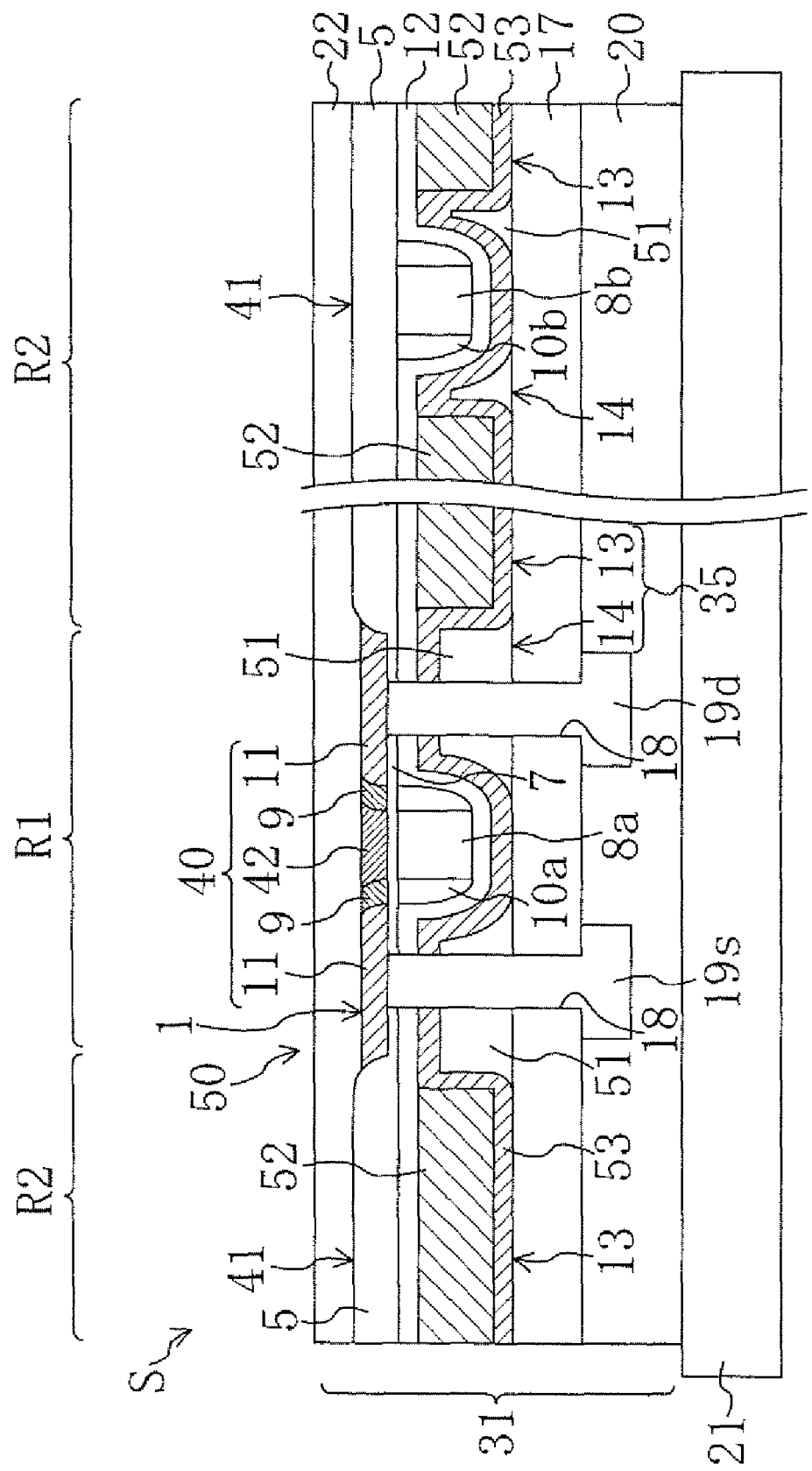
FIG. 14 is a sectional diagram schematically illustrating a structure of a semiconductor device according to Embodiment 3.
Figure 15:
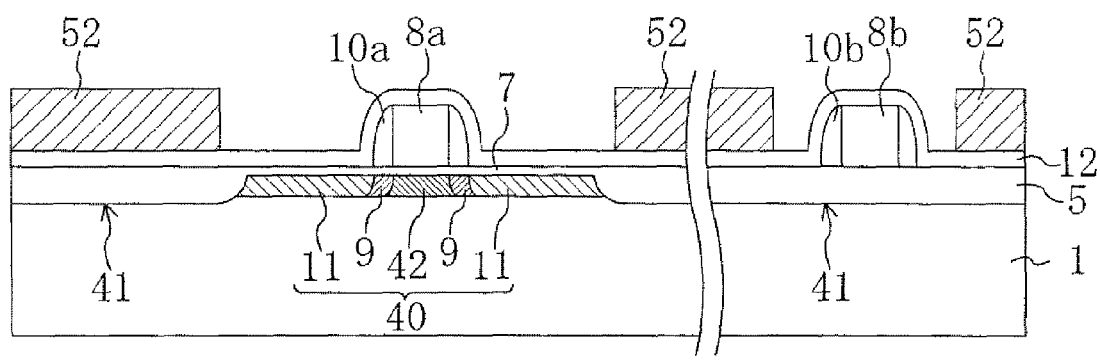
FIG. 15 is a sectional diagram illustrating a structure that includes a second insulating film formed therein.

Referring to FIG. 14, the first planarization film 13 includes a third insulating film 53 provided on an interlayer insulating film 17 and a second insulating film 52 interposed between the third insulating film 53 and an interlayer insulating film 12. Also, lateral surfaces of the second insulating film 52 are covered with the third insulating film 53.

The second planarization film 14 is constituted of a first insulating film 51 provided on the interlayer insulating film 17 and the third insulating film 53 interposed between the first insulating film 51 or interlayer insulating film 17 and the interlayer insulating film 12. The third insulating film 53 is interposed between the interlayer insulating film 17 and the interlayer insulating film 12 in the region facing a gate electrode 8a or gate wiring layer 8b.

The second insulating film 52 of the present embodiment is a silicon oxide film whereas the second insulating film 52 of Embodiment 1 is a silicon nitride film. That is, the second insulating film 52 and the first insulating film 51 are each formed of a silicon oxide film, which is the same material as that of a LOCOS oxide film 5, and the third insulating film 53 is formed of a silicon nitride film, for example.

The first planarization film 13 and the second planarization film 14 constitute a planarization film 35, and the surfaces of the first planarization film 13 and the second planarization film 14 opposite to an active region 40 have continuous, flat coplanar surfaces. Also, the surface of the first planarization film 13 opposite to the active region 40 is constituted of the third insulating film 53, which is a silicon nitride film. The surface of the second planarization film 14 opposite to the active region 40 is constituted of the first insulating film 51, which is at least partially a silicon oxide film.

—Production Method—

In the method for producing the semiconductor device S according to the present embodiment, part of the first planarization film formation step and part of the second planarization film formation step in Embodiment 1 (i.e. the step of forming the third insulating film 53 which will be described later) are concurrently performed.

First, part of the method of Embodiment 1 up to the activation step are performed. Thereafter, in the first planarization film formation step, referring to FIG. 15, the second insulating film 52 having a flat surface is formed in at least part of a flat portion of each of the second regions R2 to have a uniform thickness.

Specifically, the second insulating film 52, which is a silicon oxide film, is first deposited on the overall surface of the interlayer insulating film 12 in the first region R1 and the second region R2 so as to have the same height as the interlayer insulating film 12 facing the gate electrode 8a and gate wiring layer 8b. Thereafter, the second insulating film 52 is removed at least from the first region R1 to expose the interlayer insulating film 12. Further, the second insulating film 52 is removed at least from part of the second region R2 where the gate wiring layer 8b and sidewalls 10b are provided. Thus, the flat second insulating film 52 is left in at least part of a flat portion of the second region R2 facing the LOCOS film 5.

Figure 16:
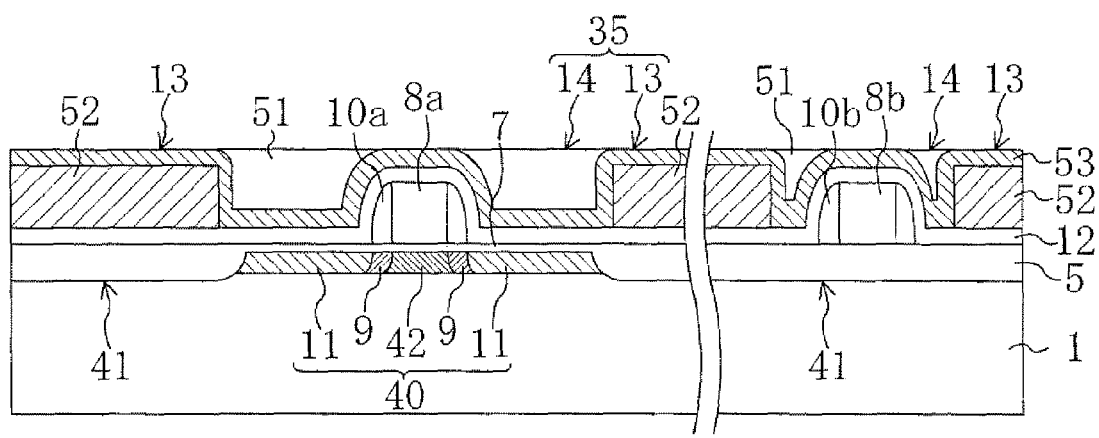
FIG. 16 is a sectional diagram illustrating a structure that includes a first insulating film and third insulating film formed therein.

Subsequently, referring to FIG. 16, the third insulating film 53 is formed of a material different from that of the second insulating film 52 in the overall first region R1 and second region R2 to be a thin film extending over the interlayer insulating film 12 and the second insulating film 52 left in the second region R2. For example, the third insulating film 53 may be a silicon nitride film. The step of forming the third insulating film 53 is common to the first planarization film formation step and the second planarization film formation step.

Each of the surfaces of the third insulating films 53 covering the second insulating films 52 has the same height. The surfaces of the third insulating films 53 facing the gate electrode 8a or gate wiring layer 8b also have the same height as that of the third insulating films 53 covering the second insulating films 52. In this way, the first planarization film 13, constituted of the second insulating film 52 formed on the surface of the interlayer insulating film 12 and the third insulating film 53 formed on the surface of the second insulating film 52, is formed in the second region R2.

Thereafter, in the second planarization film formation step, a first insulating film 51, which is a silicon oxide film, is deposited on the overall surface of the third insulating film 53 in the first region R1 and the second region R2. Subsequently, part of the first insulating film 51 is polished away by CMP, or the like, using the first planarization film 13 as a polishing stopper. In the CMP process, a slurry containing cerium oxide ($CeO_2$) as abrasive grains is employed.

Figure 17:
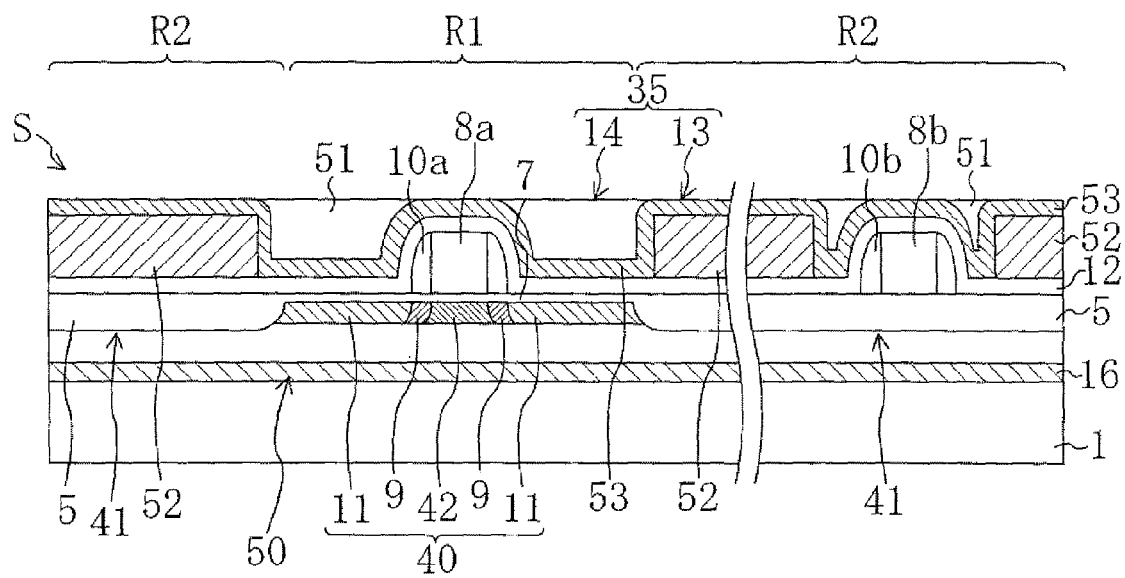
FIG. 17 is a sectional diagram illustrating the peeling layer formation step.

Due to the stopper, the CMP of the first insulating film 51 stops at the timing when the third insulating film 53 (silicon nitride film) of the first planarization film 13 is exposed and, as shown in FIG. 17, the surface of the remaining first insulating film 51 is coplanar with the surface of the first planarization film 13 (i.e. the surface of the third insulating film 53) and the surface of the third insulating film 53 facing the gate electrode 8a or gate wiring layer 8b. Consequently, the whole first planarization film 13 and second planarization film 14 constitute the planarization film 35, so that the distance 15 from the surface of the silicon substrate 1 facing the gate electrode 8a in the active region 40 to the surface of the first planarization film 13 (the surface opposite to the silicon substrate 1) can be uniform over a plurality of the first regions R1.

Then, the peeling layer formation step is performed to ion-implant hydrogen, which is a peeling material, into a silicon substrate 1 via the planarization film 35. Specifically, hydrogen is introduced into the silicon substrate 1 through the third insulating film 53 and second insulating film 52 that constitute the first planarization film 13. Also, hydrogen is introduced into the silicon substrate 1 through the first insulating film 51 and third insulating film 53 that constitute the second planarization film 14. Thus, as shown in FIG. 17, a peeling layer 16 is formed at a predetermined depth in the silicon substrate 1 from the surface of the planarization film 35.

Figure 18:
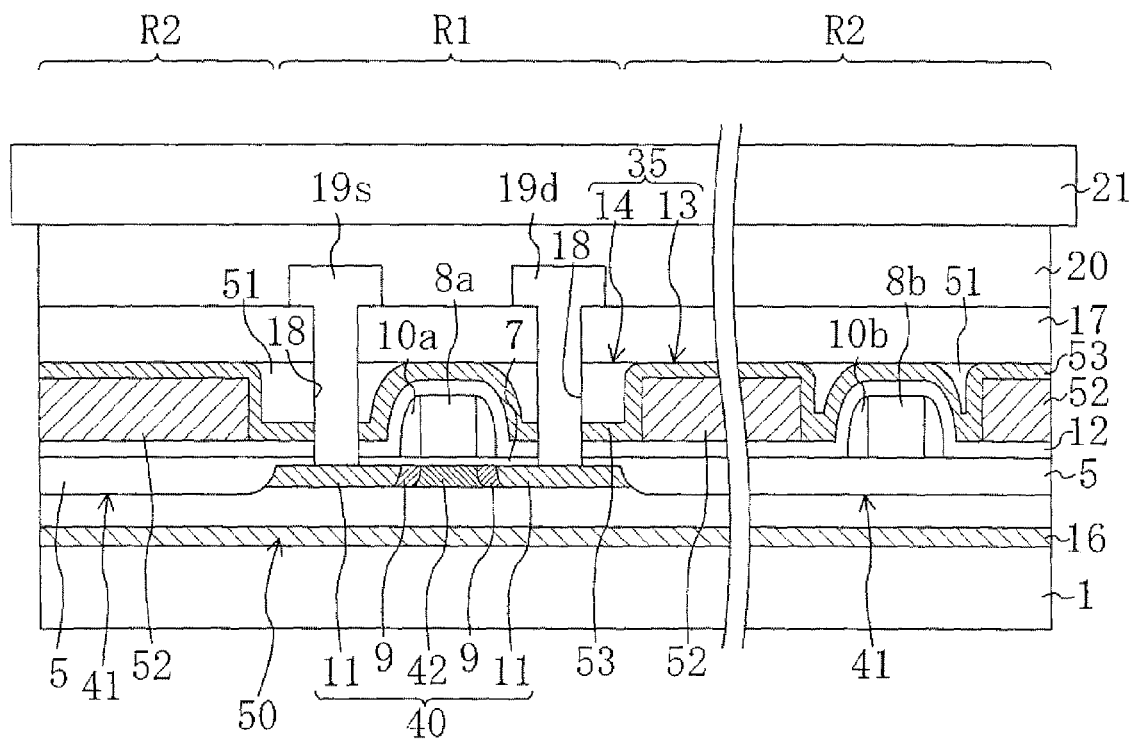
FIG. 18 is a sectional diagram illustrating the conductive part formation step, the planarization film formation step, and the bonding step.

Subsequently, as in Embodiment 1, the conductive part formation step, the planarization step, the bonding step, and the separation step are performed so that the semiconductor device S is formed as illustrated in FIG. 18.

—Effects of Embodiment 3—

Accordingly, in the present embodiment, effects similar to those of Embodiment 1 can be obtained. In addition, since the first planarization film 13 and second planarization film 14 include the silicon oxide film made of the same material as that of the LOCOS oxide film 5 and, therefore, the depth of the hydrogen implantation can readily be controlled in the ion implantation of hydrogen into the silicon substrate 1. That is, it is possible to readily and accurately form the flat peeling layer 16.

Embodiment 4 of the Invention

Figure 19:
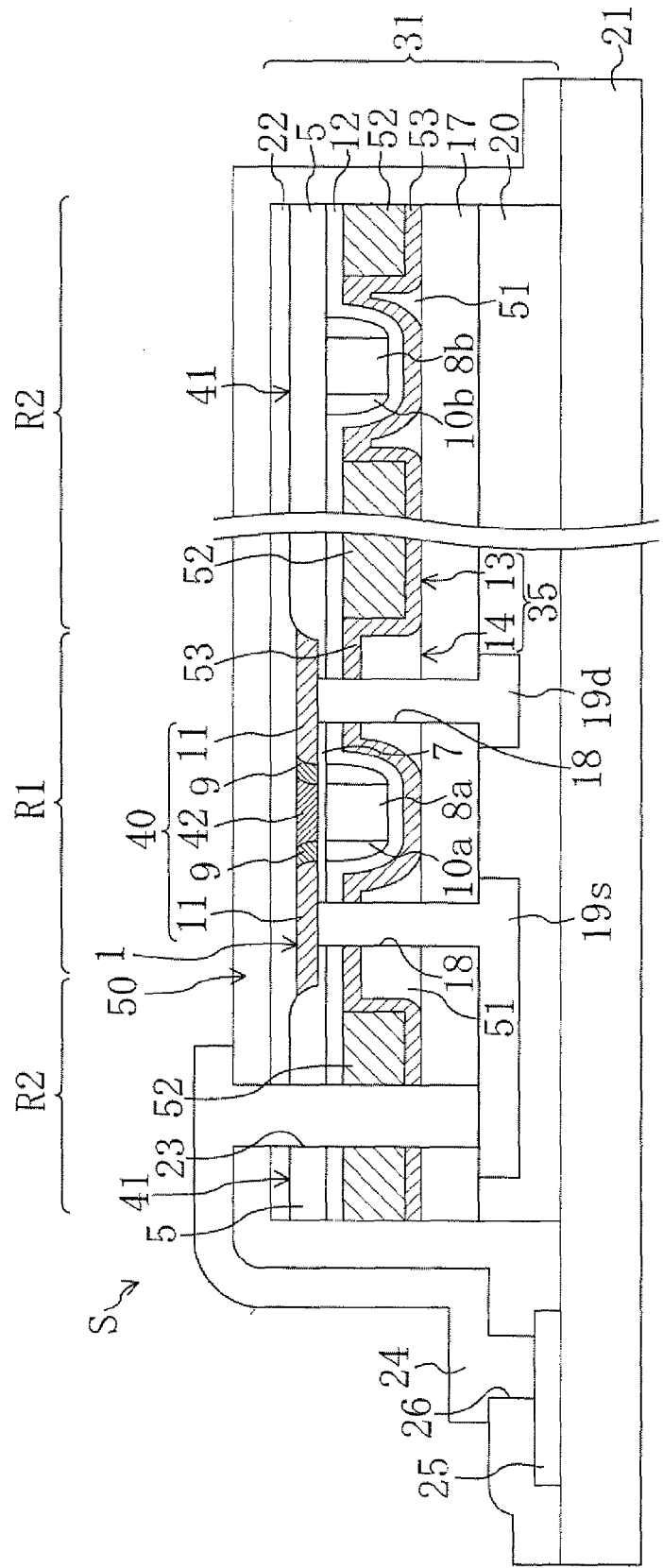
FIG. 19 is a sectional diagram schematically illustrating a structure of a semiconductor device according to Embodiment 4.
Figure 20:
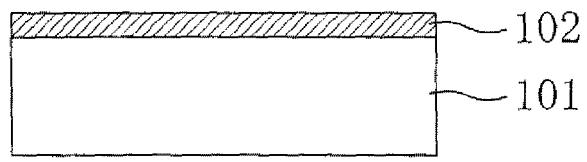
FIG. 20 is a diagram illustrating a conventional SOI substrate fabrication step where a silicon oxide layer is formed.
Figure 21:
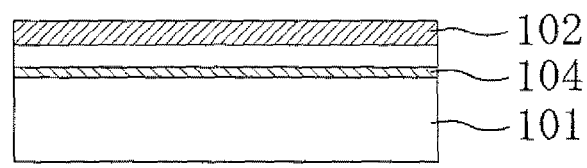
FIG. 21 is a diagram illustrating a conventional SOI substrate fabrication step where a hydrogen implanted layer is formed.
Figure 22:
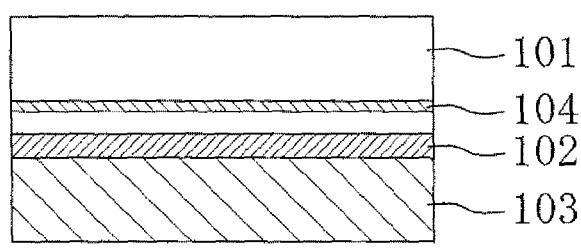
FIG. 22 is a diagram illustrating a conventional SOI substrate fabrication step where a glass substrate is bonded.
Figure 23:
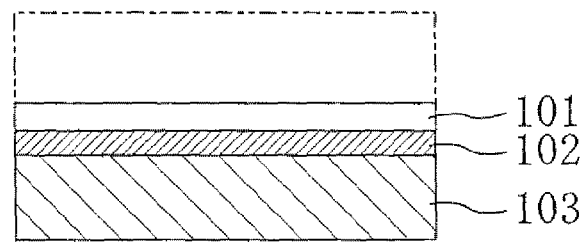
FIG. 23 is a diagram illustrating a conventional SOI substrate fabrication step where part of the silicon layer is separated.
Figure 24:
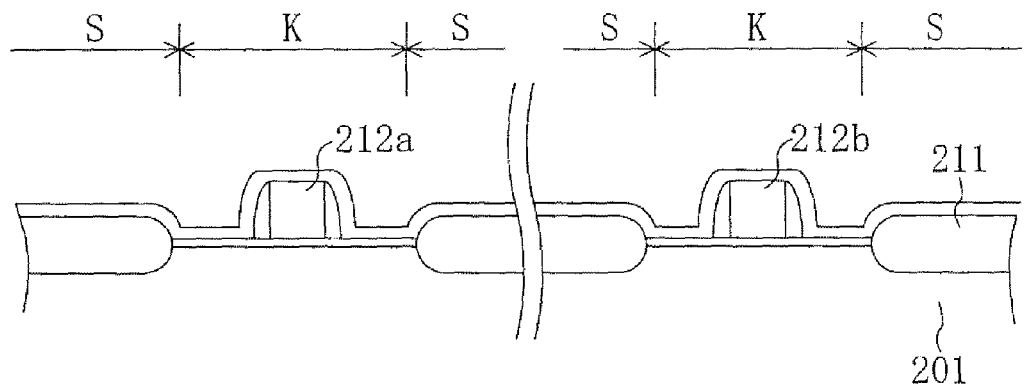
FIG. 24 is a sectional diagram illustrating a structure that includes gate electrodes formed in different regions of the silicon substrate.
Figure 25:
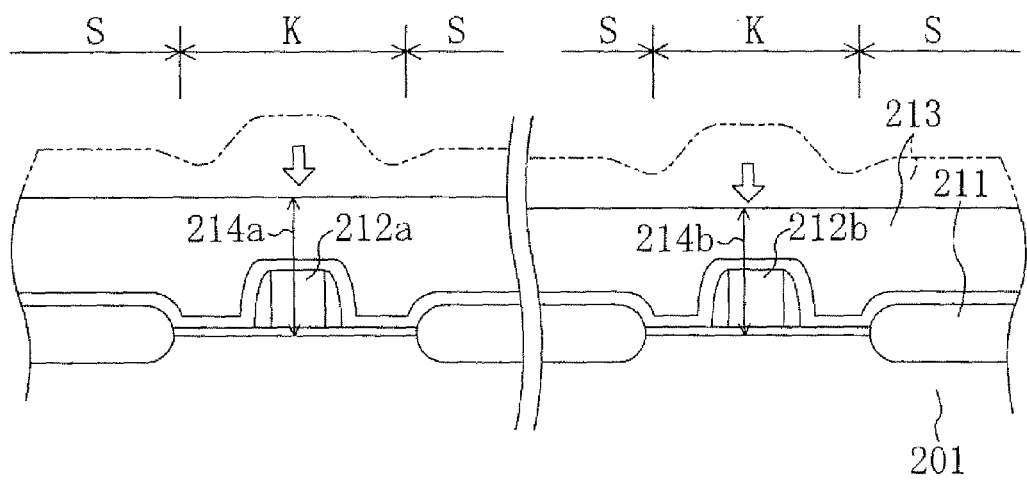
FIG. 25 is a sectional diagram illustrating a structure that includes a $SiO_2$ film for planarization on the silicon substrate.
Figure 26:
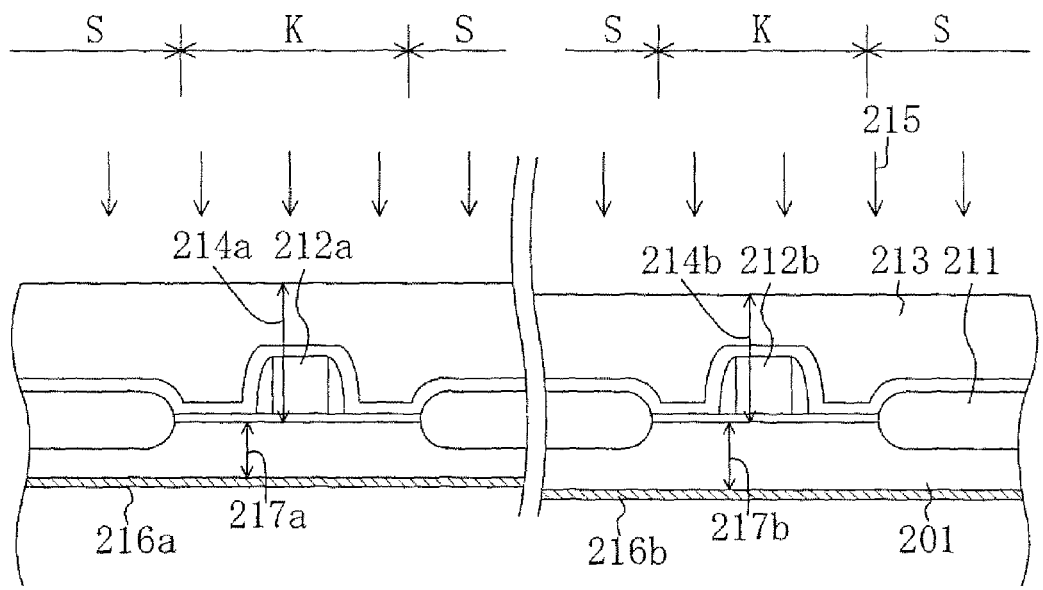
FIG. 26 is a sectional diagram illustrating a structure that includes a hydrogen implanted layer on the silicon substrate.
Figure 27:
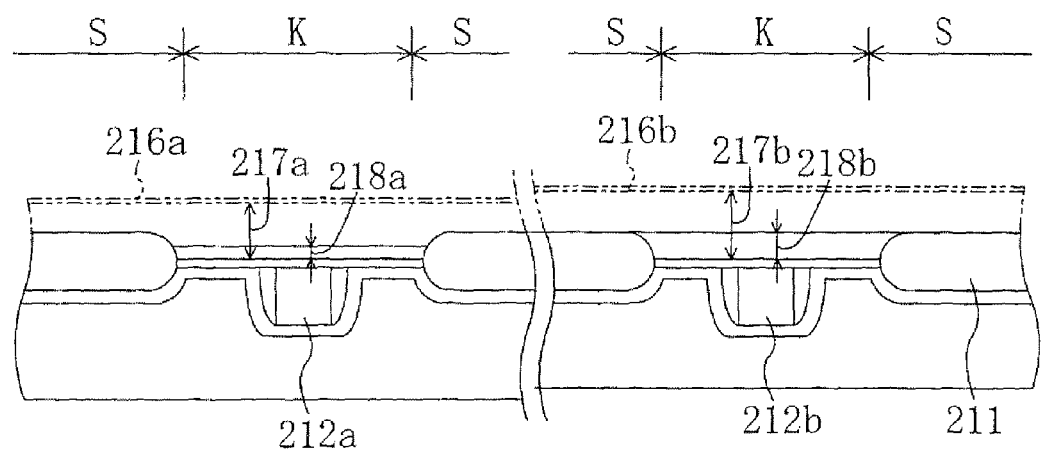
FIG. 27 is a sectional diagram illustrating a structure that includes another substrate bonded thereto and from which part of the silicon substrate is removed.

FIG. 19 is a sectional diagram illustrating Embodiment 4 of the semiconductor device S according to the present invention. In the semiconductor device S of the present embodiment, a semiconductor device part 31 having generally the same structure as in Embodiment 3 is connected to an electric element 25 previously formed on a glass substrate 21.

As shown in FIG. 19, on the glass substrate 21, the same electric element 25 as that of Embodiment 2 is provided. A protective film 22 covers an overall semiconductor device part 31 as well as the glass substrate 21 and the electric element 25 provided therearound. The semiconductor device part 31 has, above a source electrode 19s, a contact hole 23 vertically penetrating through an interlayer insulating film 17, a first planarization film 13 (a third insulating film 53 and a second insulating film 52), an interlayer insulating film 12, a LOCOS oxide film 5, and the protective film 22. The protective film 22 on the electric element 25 has a contact hole 26 penetrating through the protective film 22. Thus, the source electrode 19s and electric element 25 are connected together via a metal wire electrode 24 as in Embodiment 2.

Other Embodiments of the Invention

In the above-described embodiments, the trench 36 is formed in advance in the substrate 1 for the purpose of making the surface of the LOCOS oxide film 5 coplanar with the gate oxide film 7 so that the active region 40 and the device isolation region have equal heights, to which however the present invention is not limited. According to the present invention, the silicon nitride film 3 may be removed after the formation of the LOCOS oxide film 5, followed by the CMP process of the LOCOS oxide film 5. Also, the device isolation region may be formed by means of STI (Shallow Trench Isolation), or the like. Alternatively, the trench 36 may not be formed, so that the active region 40 and the device isolation region may have different heights.

INDUSTRIAL APPLICABILITY

As described above, the present invention is useful for, for example, a semiconductor device and method for producing the same applied to a liquid crystal display device and is particularly suitable for making the thickness of a base layer uniform where active regions are formed to improve the reliability of the semiconductor device.

The invention claimed is:

1. A method for producing a semiconductor device that has a plurality of first regions in which active regions are formed on a base layer and second regions each provided between the first regions to form device isolation regions, the method comprising:
   a first planarization film formation step of forming, in at least part of a flat portion of the second regions, a first planarization film so as to have a flat surface and a uniform thickness, the entirety of the first planarization film having the flat surface and uniform thickness, such that the surface of the planarization film is planar;
   a second planarization film formation step of forming a second planarization film between the first planarization films to be coplanar with a surface of the first planarization film;
   a peeling layer formation step of forming a peeling layer by ion implantation of a peeling material into the base layer via the first planarization film or the second planarization film; and
   a separation step of separating part of the base layer along the peeling layer.

2. The method of claim 1, wherein the second planarization film formation step includes forming a first insulating film at least between the first planarization films so as to have a height higher than the surface of the first planarization film and polishing away part of the first insulating film using the first planarization film as a stopper, so that the surface of the first insulating film is coplanar with the surface of the first planarization film.

3. The method of claim 2, wherein the first planarization film formation step includes forming a second insulating film in the first region and the second region and subsequently removing the second insulating film at least from the first region, so that the second insulating film remains at least in part of the second regions, and the first planarization film includes the second insulating film remaining in the second region.

4. The method of claim 3, wherein the first planarization film formation step includes forming the second insulating film as the only first planarization film.

5. The method of claim 4, wherein:
   the second insulating film is a silicon nitride film; and
   the first insulating film is a silicon oxide film.

6. The method of claim 3, wherein:
   an insulating film for device isolation is formed in the device isolation region;
   the second insulating film is formed of a same material as that of the insulating film for device isolation; and
   the first planarization film formation step includes forming a third insulating film of a material different from that of the second insulating film on the second insulating film remaining in the second region, so that the second insulating film and the third insulating film constitute the first planarization film.

7. The method of claim 6, wherein:
the first insulating film and the second insulating film are silicon oxide films; and
the third insulating film is a silicon nitride film.

8. The method of claim 1, further comprising a gate electrode formation step of forming a gate electrode in the first region,
wherein the first planarization film formation step includes forming the first planarization film so as to have a height higher than a surface of the gate electrode.

9. The method of claim 1, further comprising a bonding step of bonding a substrate onto the first planarization film and the second planarization film with an insulating film interposed therebetween,
wherein the bonding step is performed prior to the separation step.

10. The method of claim 9, wherein the substrate is a glass substrate or silicon substrate.

11. The method of claim 1, wherein the base layer is any one of a silicon layer, a silicon carbide layer, a silicon germanium layer, a germanium layer, a gallium nitride layer, a gallium arsenic layer, an indium phosphide layer, a $LiNbO_3$ layer, a $LaAlO_3$ layer, and a $SrTiO_3$ layer.

12. The method of claim 1, wherein the peeling material is at least any one of hydrogen and an inert element.

13. The method of claim 2, wherein the second planarization film formation step includes planarizing the first insulating film by CMP (Chemical Mechanical Polishing).

14. The method of claim 1, wherein a MOS transistor is formed in the first region.

* * * * *

UNITED STATES PATENT AND TRADEMARK OFFICE
CERTIFICATE OF CORRECTION

PATENT NO. : 8,008,205 B2
APPLICATION NO. : 12/159582
DATED : August 30, 2011
INVENTOR(S) : Fukushima et al.

It is certified that error appears in the above-identified patent and that said Letters Patent is hereby corrected as shown below:

Title Page: Please insert:

--(30) Foreign Application Priority Data March 8, 2006 (JP)...................2006-063170

Signed and Sealed this
Seventeenth Day of January, 2012

David J. Kappos
*Director of the United States Patent and Trademark Office*